(12) United States Patent
Alsleben et al.

(10) Patent No.: US 11,675,019 B2
(45) Date of Patent: Jun. 13, 2023

(54) REMOTE BATTERY ESTIMATION

(71) Applicant: Appareo IoT, LLC, Fargo, ND (US)

(72) Inventors: Keith Alsleben, Alexandria, MN (US); Bradley Schleusner, Fargo, ND (US)

(73) Assignee: Appareo IoT, LLC, Fargo, ND (US)

( * ) Notice: Subject to any disclaimer, the term of this patent is extended or adjusted under 35 U.S.C. 154(b) by 0 days.

(21) Appl. No.: 17/788,496

(22) PCT Filed: Dec. 23, 2020

(86) PCT No.: PCT/US2020/066824
§ 371 (c)(1),
(2) Date: Jun. 23, 2022

(87) PCT Pub. No.: WO2021/133902
PCT Pub. Date: Jul. 1, 2021

(65) Prior Publication Data
US 2023/0034616 A1 Feb. 2, 2023

Related U.S. Application Data

(60) Provisional application No. 62/953,192, filed on Dec. 23, 2019.

(51) Int. Cl.
*G01R 31/392* (2019.01)
*G01R 31/367* (2019.01)
*G01R 31/371* (2019.01)

(52) U.S. Cl.
CPC ......... *G01R 31/392* (2019.01); *G01R 31/367* (2019.01); *G01R 31/371* (2019.01)

(58) Field of Classification Search
CPC .................................................. G01R 31/371

USPC ............................................................ 702/63
See application file for complete search history.

(56) References Cited

U.S. PATENT DOCUMENTS

| | | | |
|---|---|---|---|
| 6,532,425 B1* | 3/2003 | Boost | G01R 31/3648 320/136 |
| 2005/0001627 A1* | 1/2005 | Anbuky | G01R 31/392 700/297 |
| 2016/0077159 A1 | 3/2016 | Petrucelli | |
| 2017/0182906 A1* | 6/2017 | Park | G07C 5/0808 |
| 2018/0001744 A1 | 1/2018 | Vehr et al. | |
| 2018/0080995 A1* | 3/2018 | Heinen | B60L 58/16 |
| 2018/0113500 A1 | 4/2018 | Loeffler et al. | |
| 2019/0033381 A1* | 1/2019 | Karner | G01R 31/3647 |
| 2019/0033393 A1 | 1/2019 | Karner et al. | |
| 2020/0014238 A1* | 1/2020 | Daniels | H01M 10/482 |

FOREIGN PATENT DOCUMENTS

| | | |
|---|---|---|
| WO | 2013158401 | 10/2013 |
| WO | 2017091231 | 6/2017 |
| WO | 2020115761 A1 | 11/2020 |

OTHER PUBLICATIONS

International Search Report for PCT/US2020/066824, dated Mar. 26, 2021. 2 pages.

(Continued)

*Primary Examiner* — Ricky Go
(74) *Attorney, Agent, or Firm* — Danielson Legal LLC

(57) ABSTRACT

Predicting battery life including wirelessly receiving an initial state of a battery and a tracked event associated with the battery at a cloud-based server, and updating an estimate of the battery life using the tracked event.

11 Claims, 5 Drawing Sheets

(56) References Cited

OTHER PUBLICATIONS

Written Opinion for PCT/US2020/066824, dated Mar. 26, 2021. 5 pages.
International Preliminary Report on Patentability for PCT/US2020/066824, dated Dec. 23, 2021. 13 pages.
Replacement International Preliminary Report on Patentability for PCT/US2020/066824, dated Jun. 29, 2022. 4 pages.

\* cited by examiner

REMOTE BATTERY ESTIMATION

CROSS REFERENCE TO RELATED APPLICATIONS

The present application is the national phase of International (PCT) Patent Application No. PCT/US2020/066824, filed internationally on Dec. 23, 2020, and claims the benefit of and priority to U.S. provisional application No. 62/953,192, filed on Dec. 23, 2019, the entire disclosures of each of which are incorporated by reference as if set forth in their entirety herein.

TECHNICAL FIELD

Embodiments described herein generally relate to systems and methods for predicting battery life, and more particularly to systems and methods configured to wirelessly receive tracked events and the initial state of a battery and use the tracked events to update an estimate of the battery life.

BACKGROUND

Common implementations for determining remaining battery capacity depend on direct, on-device battery capacity measurement. Direct battery capacity measurement typically uses an integrated circuit located on the device, which monitors the electrical current flowing into and out of the battery.

Common implementations produce accurate measurements of remaining battery capacity, but add to the total cost of the device. For very low power devices, the addition of a direct sensor negatively impacts the life of the battery, as direct sensors draw non-trivial amounts of battery current.

Other common implementations for determining remaining battery capacity create a characteristic model of the battery and use events, measurements, and usage behavior on-device to predict remaining battery capacity. This implementation removes the need for direct battery capacity measurement, but the model used is local to the device, and cannot be improved using information from other devices.

A need exists, therefore, for methods and devices that overcome the disadvantages of existing battery estimation methods and systems.

SUMMARY

This summary is provided to introduce a selection of concepts in a simplified form that are further described below in the Detailed Description. This summary is not meant or intended to identify or exclude key features or essential features of the claimed subject matter, nor is it intended to be used as an aid in determining the scope of the claimed subject matter.

According to one aspect, embodiments relate to a method for predicting battery life. In some embodiments, the method includes receiving wirelessly, at a cloud-based server, an initial state of a first battery; receiving wirelessly, at the cloud-based server, a tracked event associated with the first battery; and updating an estimate of the life of the first battery using the tracked event.

In some embodiments, the tracked event includes at least one of a battery charge measurement, a number of wireless transmissions using the battery, the schedule of wireless transmissions using the battery, power-consuming events using the battery, battery voltage, battery temperature, battery location, a correction based on a prior estimate, weather data, or battery usage time.

In some embodiments, the method further includes aggregating a plurality of estimates for a plurality of batteries being the same type as the first battery; and using the aggregated estimates to update the estimate for the first battery.

In some embodiments, the method further includes aggregating a plurality of estimates for a plurality of batteries, each battery in the plurality associated with a plurality of tracked events, the plurality of tracked events being similar to the plurality of tracked events associated with the first battery; and using the aggregated estimates to update the estimate for the first battery.

In some embodiments, the method further includes updating the estimate of the life of the first battery based on a plurality of past tracked events associated with the first battery.

In some embodiments, the method further includes computing a plurality of estimated battery lives for the first battery, each estimated battery life associated with a different prediction of future usage events.

In some embodiments, the method further includes confirming that the estimate of the life of the first battery is within statistical norms for other batteries having the same type as the first battery, prior to updating the estimate.

In some embodiments, the method further includes sending an alert when the estimate of the life of the first battery falls below a threshold value.

In some embodiments, the tracked event is battery temperature and the method further comprises comparing battery temperature to a known ambient temperature in the location of the battery prior to using weather data to update the estimate of the life of the first battery.

In some embodiments, the wireless communications utilize a cell tower, and further comprising estimating the location of the first battery based on the location of the utilized cell tower.

In another aspect, embodiments relate to a system for predicting battery life. In some embodiments, the system includes a cloud-based server comprising a processor, wherein the cloud-based server is configured to receive wirelessly from a wireless transceiver an initial state of a first battery; receive wirelessly from the wireless transceiver a tracked event associated with the first battery; and update, using the processor, an estimate of the life of the first battery using the tracked event.

In some embodiments, the tracked event comprises at least one of a battery charge measurement, a number of wireless transmissions using the battery, the schedule of wireless transmissions using the battery, power-consuming events using the battery, battery voltage, battery temperature, battery location, a correction based on a prior estimate, weather data, or battery usage time.

In some embodiments, the cloud-based server is further configured to: aggregate a plurality of estimates for a plurality of batteries being the same type as the first battery; and use the aggregated estimates to update the estimate for the first battery.

In some embodiments, the cloud-based server is further configured to compute a plurality of estimated battery lives for the first battery, each estimated battery life associated with a different prediction of future usage events.

In some embodiments, the cloud-based server is further configured to send an alert when the estimate of the life of the first battery falls below a threshold value.

In some embodiments, the tracked event is battery temperature and the system is further configured to compare the battery temperature to a known ambient temperature in the location of the battery prior to using weather data to update the estimate of the life of the first battery.

In some embodiments, the cloud-based server is further configured to update the estimate of the life of the first battery based on a plurality of past tracked events associated with the first battery.

In yet another aspect, embodiments relate to an apparatus for communicating battery life. In some embodiments, the apparatus includes at least one measurement device in communication with a battery; and a wireless transmitter in communication with the measurement device, wherein the apparatus is configured to measure an event associated with the battery; and wirelessly transmit the measured event to a cloud-based server, wherein the server is configured to use the event to estimate the battery life of the battery.

In some embodiments, the event comprises at least one of the location data of the battery, a voltage reading of the battery, a temperature reading of a device associated with the battery, ambient temperature of the device associated with the battery; an amount of time the device spent awake, an amount of time spent with an activated cellular radio on the device, an amount of time spent with a charger connected to a device, or usage behavior of the device associated with the battery.

In some embodiments, the wireless transmitter is further configured to send an alert when the measured event is below a threshold value.

BRIEF DESCRIPTION OF DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Various embodiments are described more fully below with reference to the accompanying drawings, which form a part hereof, and which show specific exemplary embodiments. However, the concepts of the present disclosure may be implemented in many different forms and should not be construed as limited to the embodiments set forth herein; rather, these embodiments are provided as part of a thorough and complete disclosure, to fully convey the scope of the concepts, techniques and implementations of the present disclosure to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one example implementation or technique in accordance with the present disclosure. The appearances of the phrase "in one embodiment" in various places in the specification are not necessarily all referring to the same embodiment.

In addition, the language used in the specification has been principally selected for readability and instructional purposes and may not have been selected to delineate or circumscribe the disclosed subject matter. Accordingly, the present disclosure is intended to be illustrative, and not limiting, of the scope of the concepts discussed herein.

Embodiments herein are directed to methods and systems for predicting battery life. Some embodiments described herein determine a measurement of remaining battery capacity by receiving an initial state of the battery, receiving information regarding a tracked event associated with the battery, and then updating an estimate of the life of the battery with the information regarding a tracked event. For example, in some embodiments, the system may measure the initial state of the battery by reading the voltage of the battery. In some embodiments, data may be transmitted via a wireless connection to a cloud-based server. The cloud-based server receives the data and uses it to further refine future battery life estimates for both this device and other similar devices via a statistical model it creates using the battery capacity readings. In some embodiments, the system uses no direct measurements of the battery to make a measurement of remaining battery capacity.

Figure 1:
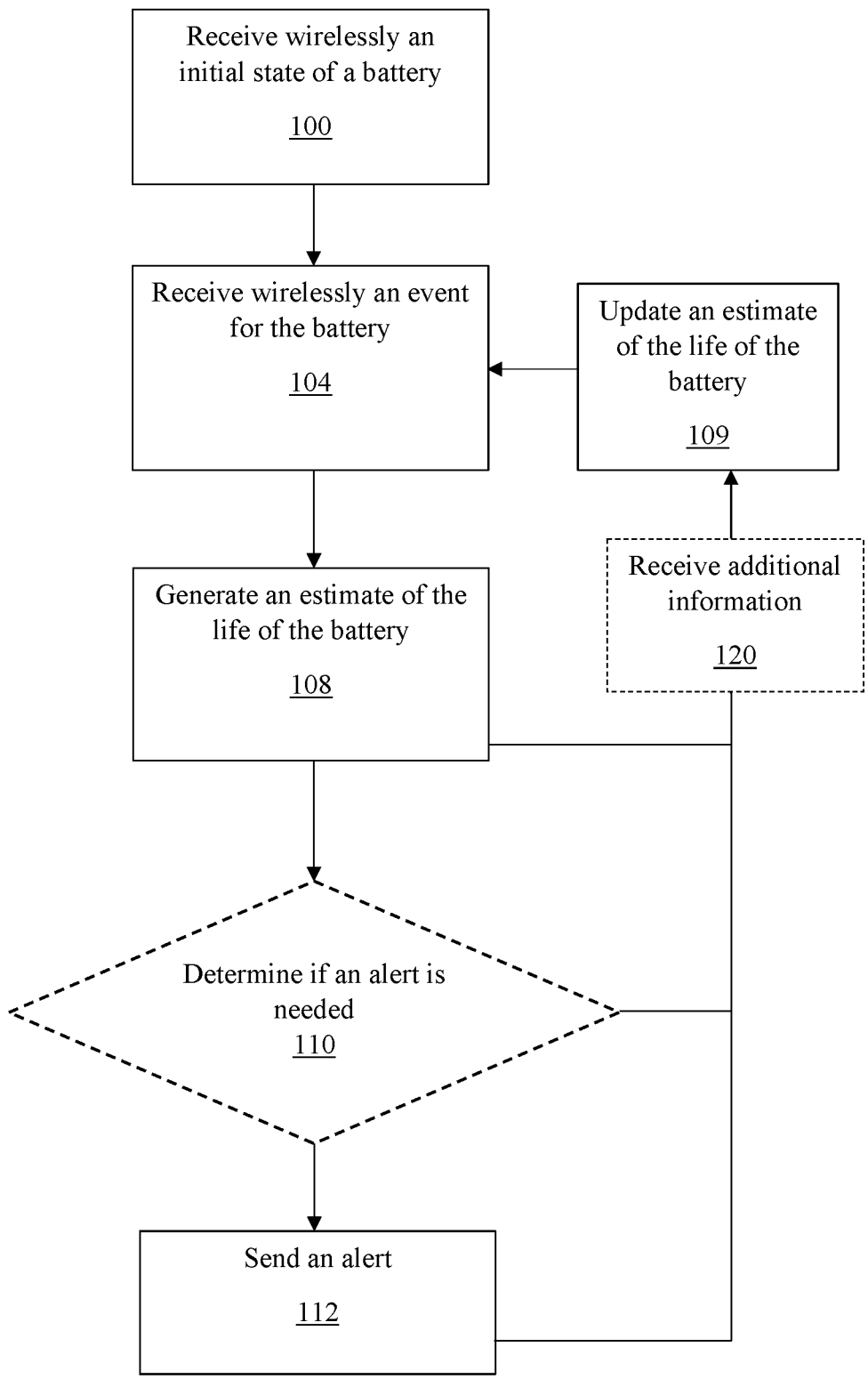
FIG. 1 is a flow chart depicting wirelessly generating an estimate of battery life

FIG. 1 is a flowchart depicting a method of wirelessly generating an estimate of battery life. A server may receive an initial state of a battery 100 from a battery external to the server. In some embodiments, the initial state of the battery may indicate that the battery is fully-charged or may include the initial percentage charge of the battery. In some embodiments, the server may wirelessly receive the initial state of the battery 100.

For example, when a device associated with the battery is activated, the device may send a reading regarding the initial state of the battery to a server. The initial state of the battery may be a fully-charged state or may be a partially-charged state. In some embodiments, the device may wirelessly transmit the initial state of the battery to the server. Some embodiments may use at least one of Bluetooth, Wi-Fi, or cellular transmission to communicate the initial state of the battery to the server. In some embodiments, the server may request an initial battery state reading. In some embodiments the server may be a cloud-based server In some embodiments, the initial state of the battery may automatically be assumed to be fully charged without accessing the battery. In some embodiments, the initial state of the battery may be a voltage reading of the battery.

In some embodiments, after the server receives an initial state of the battery 100, the server may receive an event associated with the battery 104. The event may include at least one of battery voltage, weather information, ambient temperature, expected ambient temperature, location of the battery, altitude of the battery, humidity, pH level of soil surrounding the device associated with the battery, salinity or mineral content of the water surrounding the device associated with the battery, temperature changes around the battery location over time, whether the battery is located inside a protected enclosure such as a building or outside, cellular or wireless transmission locations, or a combination of any of the listed measurements over time. In some embodiments, the event does not include battery voltage. In some embodiment, the event may be a tracked event. In some embodiments, a system may continuously track at least one event. In some embodiments, a system may periodically track at least one event. In some embodiments, the server may wirelessly receive the event. In some embodiments, the server may be a cloud-based server configured to wirelessly receive the event.

In some embodiments, the server may use the event and the initial state of the battery to generate an estimate of the life of the battery 108. In some embodiments, the estimate of the life of the battery comprises the amount of time the battery will continue powering the device(s) associated with the battery.

In some embodiments, the server may update an estimate of the life of the battery 109 after generating a first estimate of the life of the battery 108. The server may update the estimate of the life of the battery 109 based on at least one of an event, a predicted event, location event data, predicted location event data, historical location event data, detected usage of the device, predicted future usage of the device, historical usage of the device, information about other similar batteries, and aggregate information thereof. In some embodiments, the server may receive additional information about at least one of estimates for a plurality of batteries or a plurality of past events associated with the battery 120 and may use that information, alone or in aggregate form, to update the estimate of the life of the battery 109. In some embodiments, the additional information 120 may include at least one of database, almanac, or weather information.

For example, the server may use a long-running average of events received for the battery 104 to update the estimate of the life of the battery 109. The server may be configured to create an expected discharge profile of a battery based on collected information. The server may then apply the expected discharge profile to the battery's current state to generate an estimate of the life of the battery 108 and further update the estimate 109 upon receiving additional information.

It may be disadvantageous in some embodiments to check the battery's state through direct measurements of voltage or current, which may expend energy and drain the battery. Instead, to generate an estimate of the life of the battery 108 and update the estimate 109, some embodiments only use the received initial state of the battery 100 and received event(s) associated with the battery 104, wherein the event does not comprise a battery voltage reading. Some embodiments may apply additional information, such as estimates for a plurality of batteries or a plurality of past events associated with the battery 120 or aggregate information thereof to update the estimate of the life of the battery 109. Some embodiments may apply historical data or a combination of aggregate and historical data to update the estimate of the life of the battery 109. In some embodiments, the system may create a statistical model using saved battery capacity readings to update the estimate of the life of the battery 109. In some embodiments, the server may update an estimate of the battery life 109 based on at least one of an algorithm or machine learning. In some embodiments, the battery life estimate is an implementation-specific algorithm based on the actual device's use case, and specifics may be determined by through testing in the lab or in the field.

For example, in some embodiments, a server may have information that batteries have an estimated battery life of one month if kept at 20° C. inside. The server may also have information that batteries have an estimated battery life of one week if kept at a temperature between 10° C. and 15° C. outside. The server may then receive an initial state of a battery 100 that a battery is fully charged and location event data 104 indicating that the battery is in an inside location that is kept at 20° C. If the battery is kept in the same conditions, the server can generate an estimate of the life of the battery 108 at any point during the lifetime of the battery without directly measuring the state of the battery.

In some embodiments, the server may receive an event associated with the battery 104 about changes in the ambient temperature surrounding the battery and may update an estimate of the life of the battery 109 based on the updated information. For example, the server may initially generate an estimate that the battery life would be one month because the server received an event associated with the battery 104 that the battery was operating at 20° C. and received the initial state of the battery 100 as a fully charged battery. In some embodiments, the server may then receive at least one subsequent event 104 indicating that the temperature of the battery has dropped to 10° C. In some embodiments, upon receiving the subsequent event associated with the battery 104, the server may update the estimate of the life of the battery 109 and generate a new estimate of the life of the battery 108.

In some embodiments, a server may aggregate historical data regarding a battery to generate an estimate of battery life 108. For example, in some embodiments, a server may track previous battery cycles. In the past five uses of the battery, the battery may have been able to power a device for one month in an ambient temperature of 20° C. before the battery required a recharge. In another previous five uses of the battery, the battery may have been able to power a device for two weeks when in an ambient temperature of 10° C. before the battery required a recharge. In some embodiments, the server may aggregate the last ten uses of the battery and, with the location event data and the initial battery state generate an estimate of the life of the battery 108 for the current cycle.

In some embodiments, the system may then send an alert 112 to a user regarding the estimate of battery life. In some embodiments, the alert 112 may comprise the amount of time before a user needs to recharge or replace the battery. In some embodiments, the alert 112 may be sent to the user on a set schedule. For example, a user may receive an update once a day regarding the generated estimate of the life of the battery 108. In some embodiments, the user may request an updated estimate of the life of the battery 109. In some embodiments, the system may send an alert 112 through Bluetooth, Wi-Fi or cellular wireless transmission.

In some embodiments, the system may send an alert 112 to a user on a regular schedule. In some embodiments, the system may send an alert to a user when it is determined that an alert is needed 110. In some embodiments, the alert may be wirelessly transmitted to a user. In some embodiments, the user may receive the wirelessly transmitted alert 112 on a phone application, computer, or other connected device.

In some embodiments, an alert may be needed 110 when the remaining battery life meets a predetermined threshold. For example, the device may output an alert 112 to the user when the remaining battery life is less than two hours. In some embodiments, the device may output an alert 110 to the user when the remaining battery life is 50% or less of the total battery life. In some embodiments, the threshold to determine an alert is needed 110 may be predetermined. In some embodiments, the predetermined threshold may be based on the battery or the devices using the battery. In some embodiments, a user may manually set a threshold and the system may determine that an alert is needed 110 when the user-set threshold is reached or when the battery falls below the user-set threshold.

In some embodiments, an alert may be needed 110 when the estimate of the life of the battery deviates from statistical norms. For example, in some embodiments, an alert may be needed 110 when the system compares the estimate of the life of the battery to aggregated information about similar batteries and differences are identified. The comparison may indicate that the estimate of the life of the specific battery is 30% less than the battery life of other similar batteries under similar conditions. In this case, the system may determine that an alert is needed 110 to notify the user that the discharge profile of the battery differs from the aggregated discharge profiles of other batteries.

In some embodiments, an alert may be needed 110 when the system compares an estimate of the life of the battery 108 to historical information about the battery. For example, in past battery life cycles, the battery life may be approximately one month at 20° C. However, because the battery has been in use for a year, historically, the battery life estimate drops to two weeks at 20° C. based on aggregate and historical battery information regarding this battery and other similar batteries. The alert may be needed 110 and the system may send an alert 112 to the user to let the user know that the battery is deficient or expiring because the discharge profile is different than the discharge profile of a newer battery.

In some embodiments, a system may determine that an alert is needed 110 if the battery usage differs from historical data. For example, the battery may be associated with a device that typically is active for two hours a day. However, the event associated with the battery or a plurality of events associated with the battery 104 may show that the device was active for eight hours. Based on this information, the system may generate an estimate of the life of the battery 108 and, based on the extra usage, determine that an alert is needed 110. In some embodiments, the system may send an alert 112 to the user indicating excess usage.

In some embodiments, a user may use the system to track battery life on a vehicle, such as a drone, airplane, helicopter, car, boat, or other vehicle with a battery. In some embodiments, the system may send an alert 112 to show that, for example, a user left the lights on in a car overnight and the excess usage has drained the battery. In some embodiments, the user may receive the alert before going outside to drive the car.

In some embodiments, the system may generate a plurality of estimates of the life of the battery 108 based on different potential events or conditions. For example, the system may generate estimates of the life of the battery if the ambient temperature remains at 30° C., or drops to 20° C., 10° C., or 5° C. The system may also associate a likelihood of each scenario to calculate the discharge profile of the battery. The system may determine an alert is needed 110 if, in one of these scenarios, the estimate of the life of the battery matches or differs from a threshold. In some embodiments, the system may determine an alert is needed 110 if, in one of these scenarios, the estimate of life of the battery matches or differs from a threshold and the likelihood of the scenario also matches or differs from a certain threshold. For example, if the battery is outside and the temperature is predicted to drop to 15° C., the system may use the prediction to update an estimate of the life of the battery 109 and send an alert 112 to a user.

In another example, the system may generate a plurality of estimates of the life of the battery 108 based on different potential device usage conditions. For example, the system may generate one estimate of the life of the battery 108 where the device associated with the battery is powered on until the battery is drained. In some embodiments, the system may generate one estimate of the life of the battery 108 where the device associated with the battery is in a battery conserving mode, such as sleep mode, until the battery is drained. In some embodiments, the system may generate a plurality of estimates of the life of the battery 108 based on a combination of usage and other events, such as ambient temperature or humidity surrounding the device associated with the battery.

Figure 2:
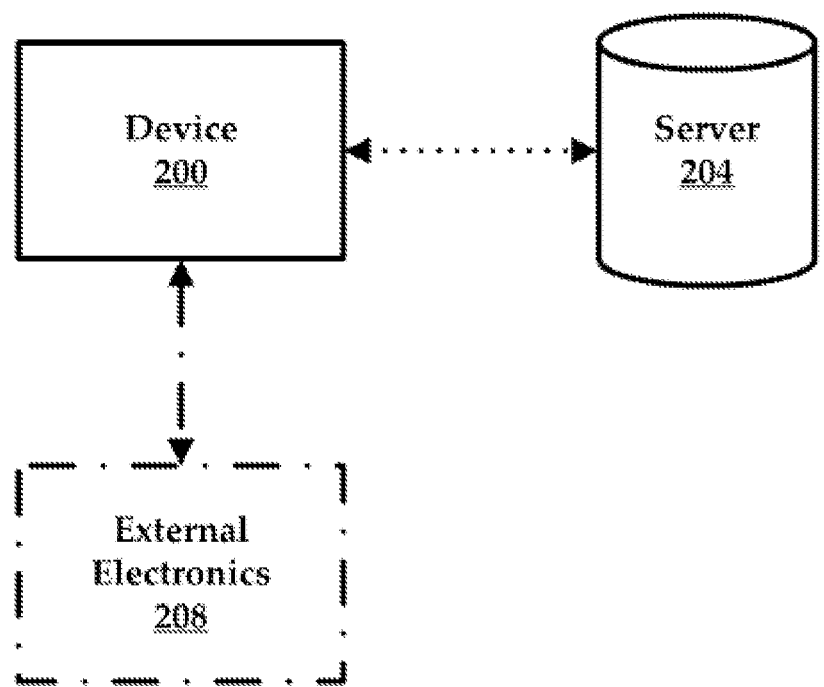
FIG. 2 is a diagram of a device in communication with a server and optionally in communication with external electronics, in accordance with one embodiment.

As shown in FIG. 2, in some embodiments, the calculations regarding the estimate of the life of the battery 108, determining if an alert is needed 110, and sending an alert 112 are all performed on a server in communication with a device associated with a battery. In some embodiments, these calculations are performed on a system separate from the device, such that the battery associated with the device is not drained during the calculation or alert processes. Computing an estimate of the battery level on a server, rather than on the device itself, reduces the complexity of the device, the battery, or both. For devices that are intended to last extended periods of time using a small battery, produced cheaply in large quantities and size optimized, reducing complexity may reduce overall device power consumption. In some embodiments, removing any component from the device that may draw power may increase the battery life of the device.

In some embodiments, the calculations of remaining battery life may be more accurate than an estimate only based on the current charge of the battery and how much charge has been depleted from the battery in the current discharge cycle. In some embodiments, batteries may not have linear voltage readings as they discharge. Some embodiments may model the trend of discharge for a battery to create more predictable estimates of a discharge pattern for a battery. Moreover, some embodiments may chart the influence of temperature or weather on the discharge time of a battery and may track the historical data of the discharge time of the battery. In some embodiments, the system may use this historical data of the discharge time for a specific battery or an aggregate group of similar batteries to generate an accurate estimate of the life of the battery 108.

FIG. 2 is a diagram of a device 200 in communication with a server 204 and optionally in communication with external electronics 208, in accordance with one embodiment. In some embodiments, the server 204 may be a cloud-based server. In some embodiments, the device 200 may transmit a battery level measurement to the server via a wireless connection. The server 204 may perform battery life calculations separately from the device 200, such that the calculations do not consume power of the battery associated with the device 200. In some embodiments, the server 204 may receive an event, such as the temperature and weather information of the environment that the device is exposed to. With the event, the server 200 may calculate an updated estimate of the life of a battery for a battery associated with the device. The server 200 may also aggregate historical information about the battery and similar batteries to forecast battery degradation. In some embodiments, the server may calculate battery degradation and estimate battery life with only an initial battery state, event(s), and aggregate information, wherein the event(s) and aggregate information are obtained without reading the voltage of the battery.

In some embodiments, a system may measure battery capacity on a subset of deployed batteries. The subset of batteries may be used to gather data needed for the server 204 to generalize battery life estimates for the entire set of batteries without drawing power from each of the deployed batteries, thereby conserving aggregate battery life.

In some embodiments, the device 200 may be in communication with external electronics 208. For example, the device 200 may comprise an engine and battery system on a tractor. The tractor may have external electronics 208 in communication with the device 200, such that, if the external electronics 208 were activated, the activity would drain the battery of the device 200. The device 200 may use a wireless transmitter to send information regarding the use of the external electronics 208 to the server 204. The server 204 may use the information to calculate an estimate of the life of the battery associated with the device 200 under varying conditions of external load.

In some embodiments, a construction equipment provider may use the system shown in FIG. 2 to track when a battery, alternator, or external electronics 208 associated with a device 200 should be replaced. Batteries on construction equipment may be used to start the engine and to power small electronics while the engine is off. These batteries are charged by the alternator while the engine is on. As such, if the system detects over time that the voltage of the battery in a specific piece of construction equipment decreased at a higher rate relative to other construction equipment or that the temperature of the device 200 is too hot relative to the other construction equipment, it could indicate that either the equipment has auxiliary power being consumed by, e.g., lights or a radio left on or that the alternator is failing.

Figure 3:
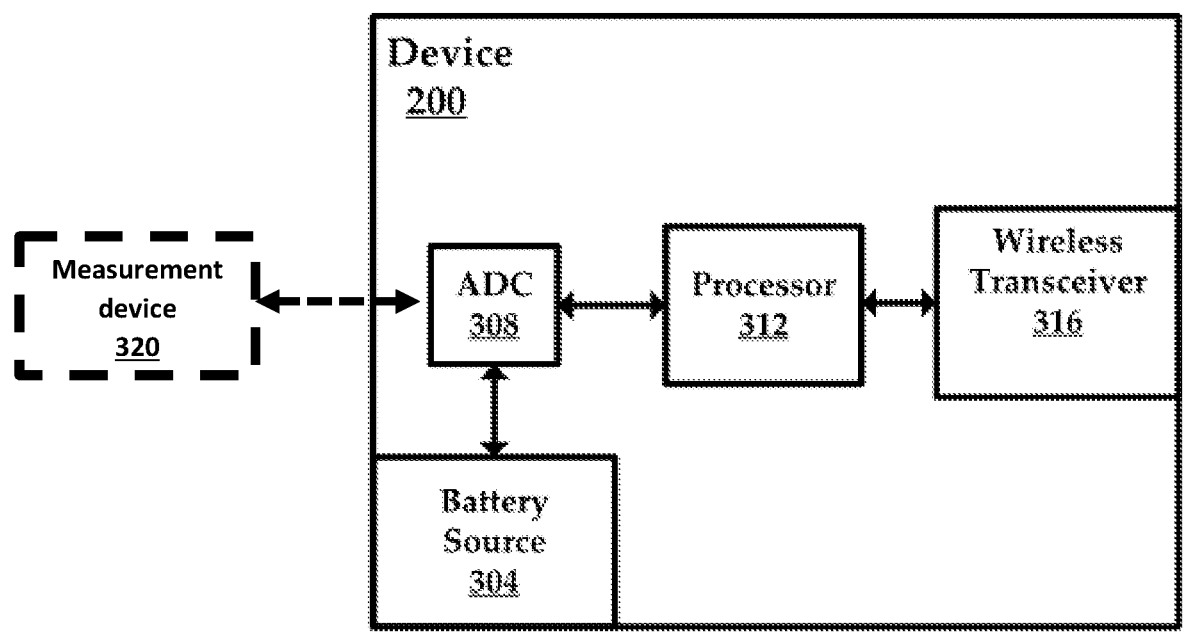
FIG. 3 presents one embodiment of the device 200 of FIG. 2 optionally in communication with a measurement device.

FIG. 3 depicts one embodiment of device 200 in more detail. Device 200 comprises an internal or external battery source 304 communicatively connected to an Analog to Digital Converter (ADC) 308. The ADC 308 is communicatively connected to a processor 312, which in turn is coupled to a wireless transceiver 316 in some embodiments. The ADC converts continuous valued measurements, such as measurements of battery voltage or temperature from battery 304 or measurements of, e.g., temperature from an optional measurement device 320, to digital values before supplying them to the processor 312 for further processing. The wireless transceiver 316 receives a communication from the processor 312 and then sends that information wirelessly via Bluetooth, cellular, Wi-Fi or other wireless to, e.g., an external server in some embodiments.

In some embodiments, the optional measurement device 320 may supply measurements, such as device location, directly to the processor 312 without intermediate conversion by the ADC 308.

In some embodiments, the device 200 may be in communication with a plurality of measurement devices 320. In some embodiments, the measurement device 320 may be at least one of a thermometer, a geolocation system (e.g., GPS), a voltmeter, a timer, a hygrometer, a pH meter, or a tracker. In some embodiments, the geolocation system may use the location of cell phone towers or other wireless transmitters to estimate the location of the device.

In some embodiments, the measurement device 320 is any device configured to detect at least one of the location data of the battery, a voltage reading of the battery, battery charge, a temperature reading of a device associated with the battery, ambient weather, ambient temperature of the device associated with the battery; an amount of time the device spent awake, an amount of time spent with an activated cellular radio on the device, an amount of time spent with a charger connected to a device, environmental humidity, environmental pH, and usage behavior of the device associated with the battery. In some embodiments, usage behavior may include at least one of the amount of time a device is active, the time spent with a cellular radio active on the device, time spent with a charger connected to a device, the number of times an action is performed on the device, the amount of time a user uses the device within a time period, the number of transmissions made by the device, the number of user initiated wake-up events within a time period, the number of wake-up events from a cellular tower within a time period, or the number of Bluetooth Low Energy (BLE) advertising beacons transmitted within a time period.

In some embodiments, the measurement device 320 may be in communication with the battery source 304. In some embodiments, the number of times a device is turned on or off may be events which diminish the battery life. If, for example, it is known that 1000 events can occur when the battery source 304 is fully charged before the battery source 304 is depleted, in some embodiments, the processor 312 may track the number of events that occur on the device 200 then send the information with the wireless transceiver 316 to an external server for further analysis.

In some embodiments, the ADC 308 and the wireless transceiver 316 can be supplied in a single chip. In some embodiments, the battery line may be connected to an ADC 308 which is placed on a printed circuit board (PCB) along with Bluetooth and cellular modems. In some embodiments, the Bluetooth and cellular modems may be located on the measurement device 320. In some embodiments, an external server may use a temperature reading from a device 200 to determine whether the device 200 is being used outside or inside. From this information, the server may determine whether weather is relevant to estimation of the life of the battery source 304.

In some embodiments, a system is configured to predict battery life with a cloud-based server 204 external to the device 200, as shown in FIG. 2. In some embodiments, the cloud-based server 204 wirelessly receives an initial state of a battery source 304 from a wireless transceiver 316 and location event data or another tracked event measured by the measurement device 320.

Figure 4:
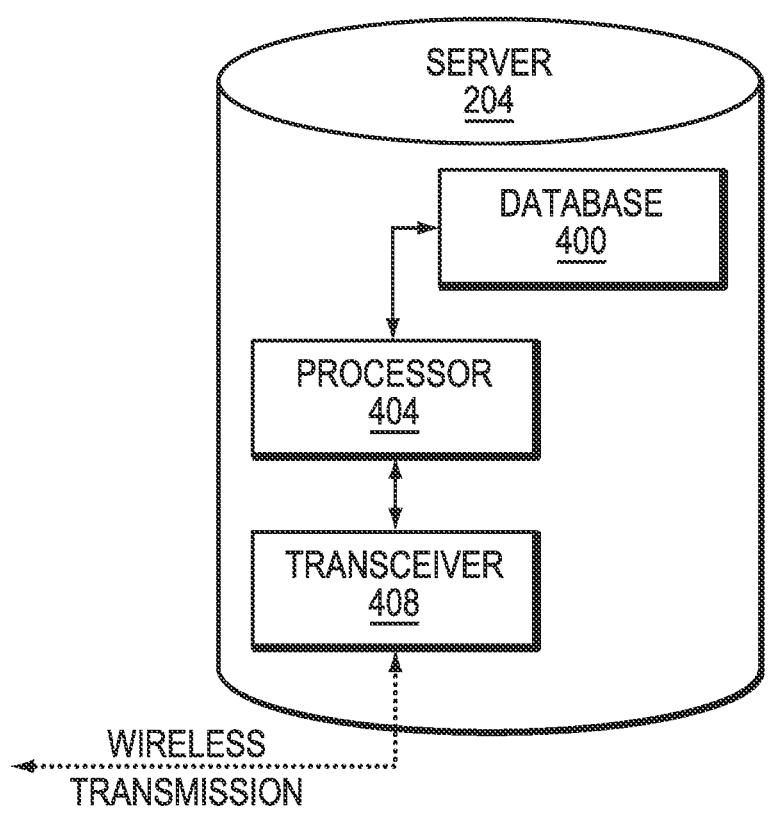
FIG. 4 presents one embodiment of the server 204 of FIG. 2.

FIG. 4 depicts one embodiment of the server 204 of FIG. 2 comprising a processor 404 communicatively connected to a database 400 and a transceiver 408. In some embodiments, the transceiver 408 is configured to wirelessly receive at least one wireless transmission associated with an external battery source, such as the battery source 304 depicted in FIG. 3.

In some embodiments, the database 400 may include almanac data, weather data, and aggregate data about various batteries. In some embodiments, the server 204 may aggregate information from multiple similar devices, each device having its own battery source. The aggregated information may include at least one of events, measurements, or usage behavior of the external device or the external battery source. The server 204 may use any aggregation technique known to someone of ordinary skill in the art. For example, in some embodiments, the server 204 may use an aggregation technique where an IoT device is configured to send event and/or behavior information to the server 204 through a wireless network. The system may also use a mesh network device configured to send information to an edge computing device, such as a smartphone or embedded computing device, in some embodiments.

In some embodiments, the server 204 may wirelessly receive information regarding the external battery source, weather information, and usage information. The server 204 may receive the information from a webpage, mobile device application, or an external device associated with a battery. The server 204 may use the information in the database with information received wirelessly through the transceiver 408 to calculate, with the processor 404, at least one of an estimated battery life of the external battery source or aberrant behavior of the external battery source.

The server 204 may use received information to correct prior estimates of battery life. For example, the server 204 may use the processor 404 to compare the most current reading of a battery source to the prior battery source readings and make corrections to prior estimates. The server 204 may use the processor 404 to compare measurements of other device lifetimes to the trend from the battery source and, in some embodiments, correct the device battery lifetime estimate based on whether the evaluated battery source is consuming less or more power than expected.

In some embodiments, the processor 404 may be an aggregation point on the server 204 and may build a statistical model of how the evaluated battery and similar batteries perform over time. The server 204 may then use the statistical model to predict the remaining battery capacity of at least one battery source. In some embodiments, the more devices used to create the statistical model, the more accurate the estimate will be for a specific battery source. With a larger data subset, the server 204 may have more information about a larger set of power draw cycles of batteries. This larger subset may allow the server 204 to identify a device with a battery deviating from the norm because, with more devices, the margin of error may be reduced in some embodiments. In some embodiments, the server 204 may use the error rate to predict future Return Merchandise Authorization ("RMA") numbers for defective devices.

The server 204 may use the processor 404 to correct the estimate of the life of the battery based on weather data. For example, the processor 404 may update predicted weather from an almanac or website with detected weather and adjust the estimated battery life accordingly.

Figure 5:
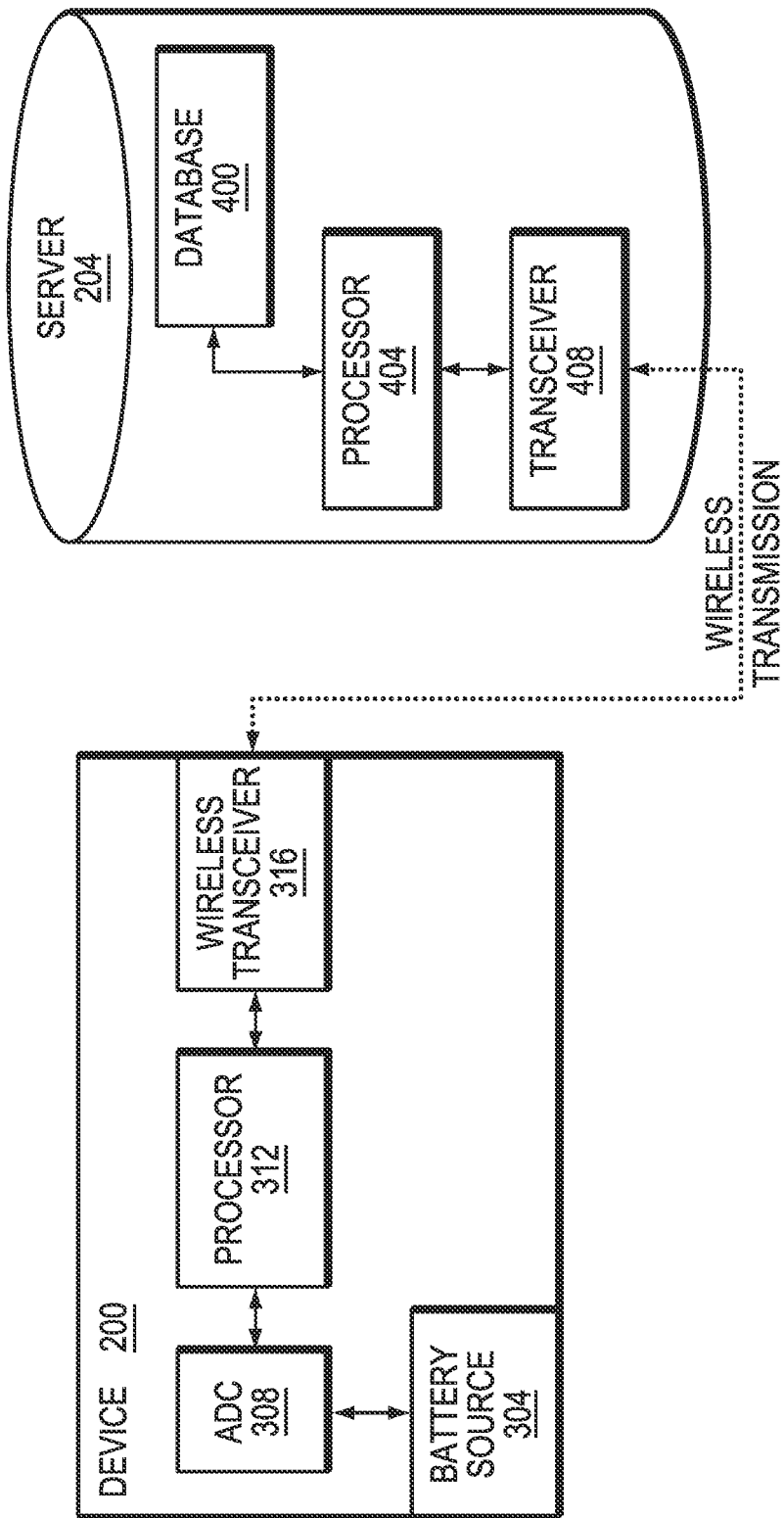
FIG. 5 is a diagram of the device 200 of FIG. 3 wirelessly communicating with the server of FIG. 4 in accordance with one embodiment.

FIG. 5 depicts the system including the device 200 in FIG. 3 wirelessly communicating with the server in FIG. 4 in accordance with an embodiment. In some embodiments, the wireless transceiver 316 may be in communication with the transceiver 408. In some embodiments, the wireless transceiver 316 and the transceiver 408 may transmit information wirelessly through at least one of Bluetooth, Wi-Fi, or cellular communication.

In some embodiments, the device 200 may wirelessly transmit information, such as events, location event data, and measurements, through the wireless transceiver 316 to the transceiver 408. In some embodiments, the processor 404 may record the primary number of transmissions that have been made by the device 200. In some embodiments, the transmissions may be periodic or aperiodic. In some embodiments, a type of event may be a measurement of the life of the battery source 304, taking location data of the device 200, and waking up the device 200. In some embodiments, measurements of the battery source 304 may include a voltage reading of the device 200, a temperature reading of the device 200, or operating conditions of the device 200. In some embodiments, the server 204 may use the number of events to calculate the remaining battery life of the battery source 304. For example, if the database 400 has information that similar battery sources 304 can transmit events 1,000 times before fully discharging, the server 204 may send a notification to the user when the device 200 has transmitted 900 events about the battery source 304, indicating that the battery source 304 may soon need to be replaced or recharged.

In some embodiments, the server 204 may process the information transmitted from the device 200 through the processor 404. The processor 404 may use the information from the database 400 and the transceiver 408 to calculate an estimate of the life of the battery source 304. In some embodiments, the server 204 may store information received about the device 200, other devices, aggregate information, historical information, and other information transmitted to the server 204 in the database 400.

The server 204 may update the estimate of the life of the battery source 304 of the device 200. For example, in some embodiments, the server 204 may receive information from the device 200 and may process the information with historical information that the device 200 has transmitted since receiving a battery charge. The server 204 may compare the battery source 304 information to historical data from other devices also deployed with similar configurations. The server may use information on weather or temperature based on the location of the device 200 or a temperature measurement sent along with the battery source 304 reading to further refine the battery lifetime estimate. In some embodiments, the server 204 may calculate the magnitude and direction of error between its predictions and actual measured results and the server may further refine its predictions of battery life.

In some embodiments, the server 204 may receive voltage measurements from the battery source 304 during the lifetime of the battery source 304. In some embodiments, the voltage measurements may not decrease linearly because, in batteries, the voltage read off generally declines rapidly as the battery is drained of power. In some embodiments, the server 204 may calculate a statistical model for the device 200 based on historical and aggregate information to determine where the reading from the device 200 falls on a graph of voltage versus charge remaining. The statistical estimate or long-running average may be revised based on the weather information and temperature readings sent from the device 200 in some embodiments. A deviation from normal may be more easily detectible when there are a number of data points that are trending in a certain direction rather than a single reading that may be a deviation in some embodiments.

Embodiments have been described herein for a device with a battery, a way to read the battery voltage, and a way to send cellular data all combined into one device. In some embodiments, the battery being monitored and read via the server may not be in the same enclosure as the cellular or cloud interface. In some embodiments, a device may have an interface for external readings (such as an external communications line in its USB connector), such that a tag could be attached to an external battery and perform the same function of giving a remote battery estimate.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one." The singular also includes the plural unless it is obvious that it is meant otherwise.

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method for predicting battery life, the method comprising:
   receiving wirelessly, at a cloud-based server, an initial state of a first battery;
   receiving wirelessly, at the cloud-based server, a tracked battery temperature of the first battery;
   generating a plurality of estimated battery lives of the first battery using the tracked battery temperature, wherein each of the estimated battery lives is associated with a different prediction of a future ambient temperature;
   comparing the tracked battery temperature to a known ambient temperature in the location of the battery; and
   updating at least one of the estimated battery lives of the first battery based on at least the comparison of the tracked battery temperature to the known ambient temperature.

2. The method of claim 1 wherein the tracked event further comprises at least one of a battery charge measurement, a number of wireless transmissions using the battery, the schedule of wireless transmissions using the battery, power-consuming events using the battery, battery voltage, battery temperature, battery location, a correction based on a prior estimate, weather data, or battery usage time.

3. The method of claim 1, further comprising:
   aggregating a plurality of estimates for a plurality of batteries being the same type as the first battery; and
   using the aggregated estimates to update the estimate for the first battery.

4. The method of claim 1, further comprising:
   aggregating a plurality of estimates for a plurality of batteries, each battery in the plurality associated with a plurality of tracked events, the plurality of tracked events being similar to the plurality of tracked events associated with the first battery; and
   using the aggregated estimates to update the estimate for the first battery.

5. The method of claim 1, further comprising confirming that an estimated battery life first battery is within statistical norms for other batteries having the same type as the first battery, prior to updating the estimate.

6. The method of claim 1, further comprising sending an alert upon at least one of the estimates of the life of the first battery falling below a threshold value.

7. The method of claim 1, wherein the wireless communications utilize a cell tower, and further comprising estimating the location of the first battery based on the location of the utilized cell tower.

8. A system for predicting battery life comprising:
a cloud-based server comprising a processor, wherein the cloud-based server is configured to:
receive wirelessly from a wireless transceiver an initial state of a first battery;
receive wirelessly from the wireless transceiver a tracked battery temperature of the first battery;
generate a plurality of estimated battery lives of the first battery using the tracked battery temperature, wherein each of the estimated battery lives is associated with a different prediction of a future ambient temperature;
compare the tracked battery temperature to a known ambient temperature in the location of the battery; and
update at least one of the estimated battery lives of the first battery based on at least the comparison of the tracked battery temperature to the known ambient temperature.

9. The system of claim 8 wherein the tracked event comprises at least one of a battery charge measurement, a number of wireless transmissions using the battery, the schedule of wireless transmissions using the battery, power-consuming events using the battery, battery voltage, battery location, a correction based on a prior estimate, weather data, or battery usage time.

10. The system of claim 8 wherein the cloud-based server is further configured to:
aggregate a plurality of estimates for a plurality of batteries being the same type as the first battery; and
use the aggregated estimates to update the estimate for the first battery.

11. The system of claim 8, wherein the cloud-based server is further configured to send an alert upon at least one of the estimates of the life of the first battery falling below a threshold value.

* * * * *